United States Patent
Hong et al.

(10) Patent No.: US 12,507,511 B2
(45) Date of Patent: Dec. 23, 2025

(54) LIGHT-EMITTING DIODE CHIP

(71) Applicant: XIAMEN SAN'AN OPTOELECTRONICS CO., LTD., Xiamen (CN)

(72) Inventors: Ling-Yuan Hong, Xiamen (CN); Xiaoliang Liu, Xiamen (CN); Qing Wang, Xiamen (CN); Minyou He, Xiamen (CN); Chung-Ying Chang, Xiamen (CN)

(73) Assignee: XIAMEN SAN'AN OPTOELECTRONICS CO., LTD., Hongtang Town (CN)

( * ) Notice: Subject to any disclaimer, the term of this patent is extended or adjusted under 35 U.S.C. 154(b) by 740 days.

(21) Appl. No.: 17/806,680

(22) Filed: Jun. 13, 2022

(65) Prior Publication Data
US 2022/0406969 A1  Dec. 22, 2022

(30) Foreign Application Priority Data
Jun. 17, 2021 (CN) .......................... 202110671682.9

(51) Int. Cl.
*H10H 20/84* (2025.01)
*H10H 20/819* (2025.01)
(Continued)

(52) U.S. Cl.
CPC ........ *H10H 20/853* (2025.01); *H10H 20/819* (2025.01); *H10H 20/831* (2025.01); *H10H 20/84* (2025.01); *H10H 20/814* (2025.01)

(58) Field of Classification Search
CPC .. H10H 20/831; H10H 20/819; H10H 20/814; H10H 29/142; H10H 20/034;
(Continued)

(56) References Cited

U.S. PATENT DOCUMENTS

| 4,775,550 A | 10/1988 | Chu et al. |
| 7,064,356 B2 * | 6/2006 | Stefanov .............. H10H 20/813 |
| | | 257/91 |

(Continued)

FOREIGN PATENT DOCUMENTS

| CN | 108475715 A | 8/2018 |
| CN | 109390446 A | 2/2019 |

OTHER PUBLICATIONS

Search Report appended to an Office Action, which was issued to Chinese counterpart application No. 202110671682.9 by the CNIPA on Feb. 23, 2022 with an English translation thereof.

*Primary Examiner* — Eduardo A Rodela
(74) *Attorney, Agent, or Firm* — MUNCY, GEISSLER, OLDS & LOWE, P.C.

(57) ABSTRACT

A light-emitting diode chip includes a light-emitting unit, a first electrode, an insulating layer, and a second electrode. The first electrode is disposed on the light-emitting unit. The insulating layer is disposed on the first electrode and the light-emitting unit, and has a through hole and a hole-defining wall. The hole-defining wall has a top peripheral edge that has two opposite end points. A projection of at least one of the end points of the top peripheral edge on the light-emitting unit falls outside a projection of a top surface of the first electrode on the light-emitting unit. The second electrode is disposed on the insulating layer and fills the through hole to electrically connect to the first electrode.

17 Claims, 11 Drawing Sheets

(51) Int. Cl.
*H10H 20/831* (2025.01)
*H10H 20/853* (2025.01)
*H10H 20/814* (2025.01)

(58) Field of Classification Search
CPC .. H10H 20/0362; H10H 20/84; H10H 20/841; H10H 20/852; H10H 20/853; F21K 9/20; G09F 9/30; F21Y 2115/10
See application file for complete search history.

(56) References Cited

U.S. PATENT DOCUMENTS

| | | | | |
|---|---|---|---|---|
| 8,309,971 | B2* | 11/2012 | Seo | H10H 20/813 |
| | | | | 257/79 |
| 10,126,831 | B2* | 11/2018 | Kim | G06F 1/1662 |
| 10,580,929 | B2* | 3/2020 | Won Cheol | H10H 20/8582 |
| 10,998,464 | B2* | 5/2021 | Kang | H10H 20/835 |
| 11,387,386 | B2* | 7/2022 | Inazu | H10H 20/831 |
| 12,230,736 | B2* | 2/2025 | Chen | H10H 20/83 |
| 12,272,765 | B2* | 4/2025 | Cha | H10H 20/856 |
| 2015/0280086 | A1* | 10/2015 | Jang | H10H 29/142 |
| | | | | 257/88 |
| 2017/0084587 | A1* | 3/2017 | Hung | H01L 25/0753 |

* cited by examiner

LIGHT-EMITTING DIODE CHIP

CROSS-REFERENCE TO RELATED APPLICATION

This application claims priority of Chinese Invention Patent Application No. 202110671682.9, filed on Jun. 17, 2021.

FIELD

The disclosure relates to a semiconductor lighting device, and more particularly to a light-emitting diode chip.

BACKGROUND

In order to avoid a luminous efficiency of a flip light-emitting diode chip being adversely affected by an electrode of the flip light-emitting diode chip that occupies a light-emitting area of the flip light-emitting diode chip, a flip light-emitting diode chip emerges. The flip light-emitting diode chip is a light-emitting diode chip in a flip-chip structure, and light emitted from a light-emitting layer of the light-emitting diode chip passes through a backside of the light-emitting diode chip (i.e., a light-transmissive substrate of the light-emitting diode chip). The conventional flip light-emitting diode chip includes a substrate, a light-emitting unit that is disposed on the substrate, and a reflection layer that is disposed on the light-emitting unit opposite to the substrate and that reflects light emitted from the light-emitting unit to pass through the substrate. The reflection layer may be made of a metal having a high reflectance (e.g., silver and aluminum), non-metallic material (e.g., distributed Bragg reflection (DBR)) and a combination thereof. The DBR is formed as a multilayered structure and includes different dielectric layers that are alternately stacked on one another. Light transmitted into the DBR may undergo a near total reflection in a certain frequency range. The flip light-emitting diode chip may also include a DBR disposed between a substrate and a light-emitting layer. In the flip light-emitting diode chip, the DBR can reflect light emitted from the light-emitting layer toward the substrate to an upper surface of the flip light-emitting diode chip.

Referring to FIGS. 1A and 1B, a conventional flip light-emitting diode chip includes an N-type semiconductor layer 910, a light-emitting layer 920, a P-type semiconductor layer 930, a first N-type electrode 911, a second N-type electrode 912, a first P-type electrode 931, a second P-type electrode 932, and a DBR layer 940. The light-emitting layer 920 is disposed on the N-type semiconductor layer 910. The P-type semiconductor layer 930 is disposed on the light-emitting layer 920 opposite to the N-type semiconductor layer 910. The first N-type electrode 911 is disposed on a portion of the N-type semiconductor layer 910 that is exposed from the light-emitting layer 920 and the P-type semiconductor layer 930. The first P-type electrode 931 is disposed on the P-type semiconductor layer 930 opposite to the light-emitting layer 920. The DBR layer 940 is disposed on the exposed portion of the N-type semiconductor layer 910, the first N-type electrode 911, the P-type semiconductor layer 930, and the first P-type electrode 931. The DBR layer 940 has at least one first through hole 9401 that exposes an upper surface of the first P-type electrode 931, at least one second through hole 9402 that exposes an upper surface of the first N-type electrode 911, and hole-defining walls that define the first through hole 9401 and the second through hole 9402, respectively. The second P-type electrode 932 is disposed on the DBR layer 940 and passes through the first through hole 9401 to electrically connect to the first P-type electrode 931. The second N-type electrode 912 is disposed on the DBR layer 940 and passes through the second through hole 9402 to electrically connect to the first N-type electrode 911.

The first through hole 9401 and the second through hole 9402 are formed by etching the DBR layer 940, and a width of a top opening of each of the first through hole 9401 and the second through hole 9402 is not smaller than a width of a bottom opening thereof. In addition, the DBR layer 940 usually has a large thickness. The configurations of the first through hole 9401 and the second through hole 9402 would affect the formation of each of the second N-type electrode 912 and the second P-type electrode 932 in a respective one of the first through hole 9401 and the second through hole 9402 and on an upper surface of the DBR layer 40 during evaporation process. As shown in FIG. 1B, the second P-type electrode 932 may be discontinuously formed and may have a fracture due to two end points $A_P$, $B_P$ of a top peripheral edge of the hole-defining wall that defines the top opening of the first through hole 9401. Likewise, the second N-type electrode 912 may be discontinuously formed and may have a fracture due to two end points $A_N$, $B_N$ of a top peripheral edge of the hole-defining wall that defines the top opening of the second through hole 9402. In addition, the discontinuous problem and fractures may also occur at end points $E_P$, $F_P$, $E_N$, $F_N$, and may directly reduce reliability of the light-emitting diode chip.

SUMMARY

An object of the disclosure is to provide a light-emitting diode chip which can alleviate or overcome the aforesaid shortcomings of the prior art.

According to the disclosure, a light-emitting diode chip includes a light-emitting unit, a first electrode, an insulating layer, and a second electrode.

The light-emitting unit includes a first conductivity type semiconductor layer, a second conductivity type semiconductor layer, and a light-emitting layer disposed between the first conductivity type semiconductor layer and the second conductivity type semiconductor layer in a laminating direction.

The first electrode is disposed on the light-emitting unit in the laminating direction.

The insulating layer is disposed on the first electrode and the light-emitting unit. The insulating layer has a through hole and a hole-defining wall that defines the through hole. The through hole penetrates through the insulating layer and terminates at a top surface of the first electrode, and has a top opening and a bottom opening opposite to the top opening. The top opening is distal from the top surface of the first electrode. The bottom opening is adjacent to the top surface of the first electrode. The hole-defining wall has a top peripheral edge that defines the top opening. The top peripheral edge has two opposite end points. A projection of at least one of the end points of the top peripheral edge of the hole-defining wall on the first conductivity type semiconductor layer falls outside a projection of the top surface of the first electrode on the first conductivity type semiconductor layer.

The second electrode is disposed on the insulating layer and fills the through hole, so as to electrically connect to the first electrode.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1A:
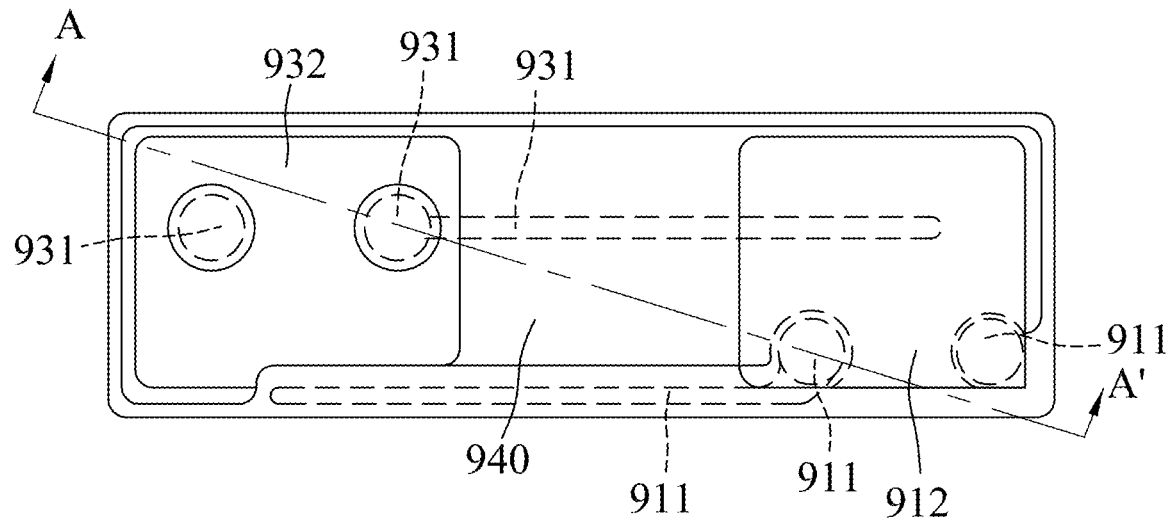
FIG. 1A is a schematic top view illustrating a conventional light-emitting diode chip according to the disclosure.
Figure 1B:
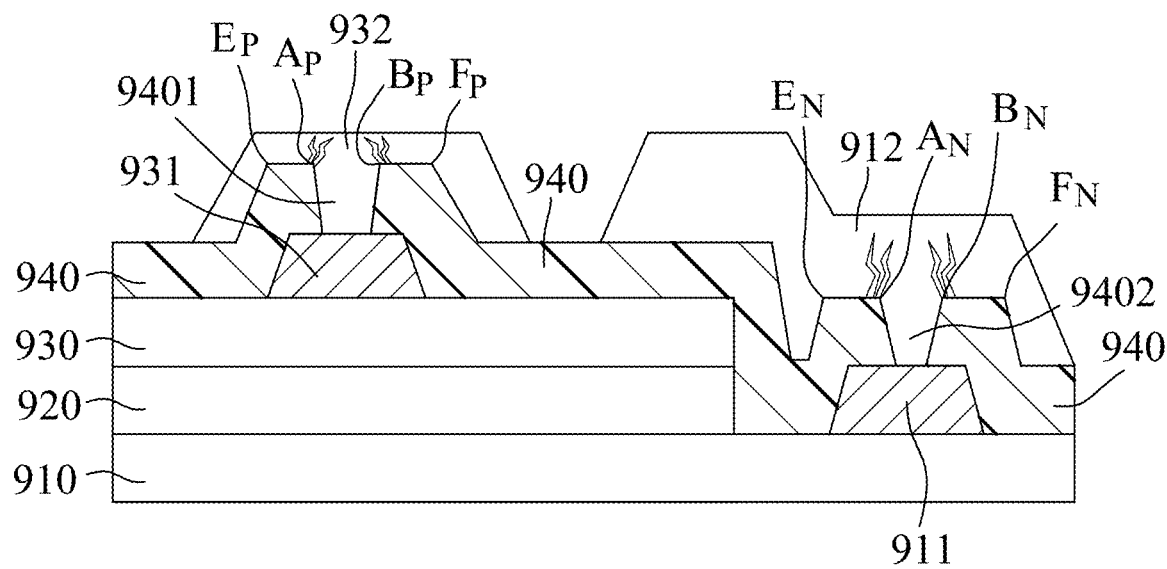
FIG. 1B is a cross-sectional view taken along line A-A' of FIG. 1A.

Before the disclosure is described in greater detail, it should be noted that where considered appropriate, reference numerals have been repeated among the figures to indicate corresponding or analogous elements, which may optionally have similar characteristics.

It should be noted that, directional terms, such as "vertical," "horizontal," "top," "bottom," "upper," "lower," "right," and "left," may be used to assist in describing the disclosure based on the orientation of the embodiments shown in the figures. The use of these directional definitions should not be interpreted to limit the disclosure in any way.

Referring to FIGS. 2A to 4, a first embodiment of a light-emitting diode chip according to the present disclosure includes a light-emitting unit, an N-type electrode unit, a first insulating layer 40, and a P-type electrode unit. The light-emitting unit includes a first conductivity type semiconductor layer 10, a second conductivity type semiconductor layer 30, and a light-emitting layer 20 disposed between the first conductivity type semiconductor layer 10 and the second conductivity type semiconductor layer 30 in a laminating direction (D). One of the first conductivity type semiconductor layer 10 and the second conductivity type semiconductor layer 30 may be an N-type semiconductor layer, and the other one of the first conductivity type semiconductor layer 10 and the second conductivity type semiconductor layer 30 may be a P-type semiconductor layer. In this embodiment, the first conductivity type semiconductor layer 10 is the N-type semiconductor layer, and the second conductivity type semiconductor layer 30 is the P-type semiconductor layer.

The N-type electrode unit and the P-type electrode unit are disposed on the light-emitting unit in the laminating direction (D). The N-type electrode unit includes a first N-type electrode 11 and a second N-type electrode 12. The P-type electrode unit includes a first P-type electrode 31 and a second P-type electrode 32.

The first insulating layer 40 is disposed on the first N-type electrode 11, the first P-type electrode 31, and the light-emitting unit. The first insulating layer 40 includes a distributed Bragg reflection (DBR) layer. The first insulating layer 40 has first through holes 401, 402, and first hole-defining walls that define the first through holes 401, 402, respectively. Each of the first through holes 401, 402 penetrates through the first insulating layer 40 and respectively terminates at a top surface of the first P-type electrode 31 and a top surface of the first N-type electrode 11. Each of the first through holes 401, 402 has a top opening and a bottom opening opposite to the top opening. The top opening of each of the first through holes 401, 402 is distal from the top surface of a respective one of the first P-type electrode 31 and the first N-type electrode 11. The bottom opening of each of the first through holes 401, 402 is adjacent to the top surface of the respective one of the first P-type electrode 31 and the first N-type electrode 11. The second P-type electrode 32 and the second N-type electrode 12 are disposed on the first insulating layer 40 in the laminating direction (D). The second P-type electrode 32 and the second N-type electrode 12 respectively fill the first through holes 401, 402, so as to electrically connect to the first P-type electrode 31 and the first N-type electrode 11, respectively.

The first hole-defining wall that defines the first through hole 401 has a top peripheral edge that defines the top opening of the first through hole 401. In this embodiment, the first insulating layer 40 further has an outer wall, and the outer wall and the first hole-defining wall intersect at the top peripheral edge. The outer wall of the first insulating layer 40 is formed as a linear structure. In this embodiment, the portion of the first insulating layer 40 that has the outer wall and the first hole-defining wall and that is formed with the first through hole 401 has a sharp tip. The top peripheral edge of the first hole-defining wall has two opposite end points $A_P$, $B_P$. A projection of at least one of the end points $A_P$, $B_P$ of the top peripheral edge of the first hole-defining wall on the first conductivity type semiconductor layer 10 falls outside a projection of the top surface of the first electrode 31 on the first conductivity type semiconductor layer 10.

Figure 2A:
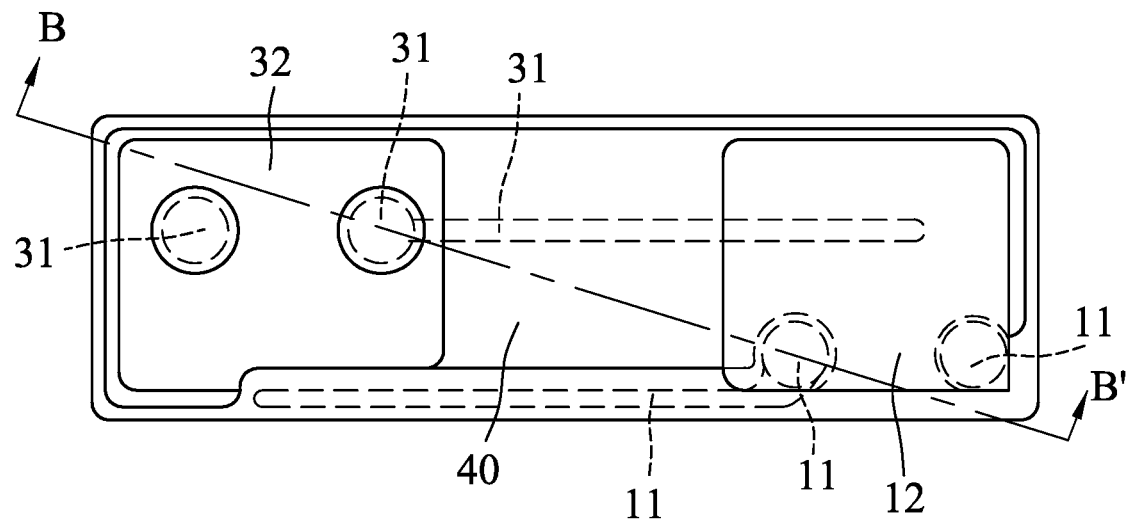
FIG. 2A is a schematic top view illustrating a first embodiment of a light-emitting diode chip according to the disclosure.
Figure 2B:
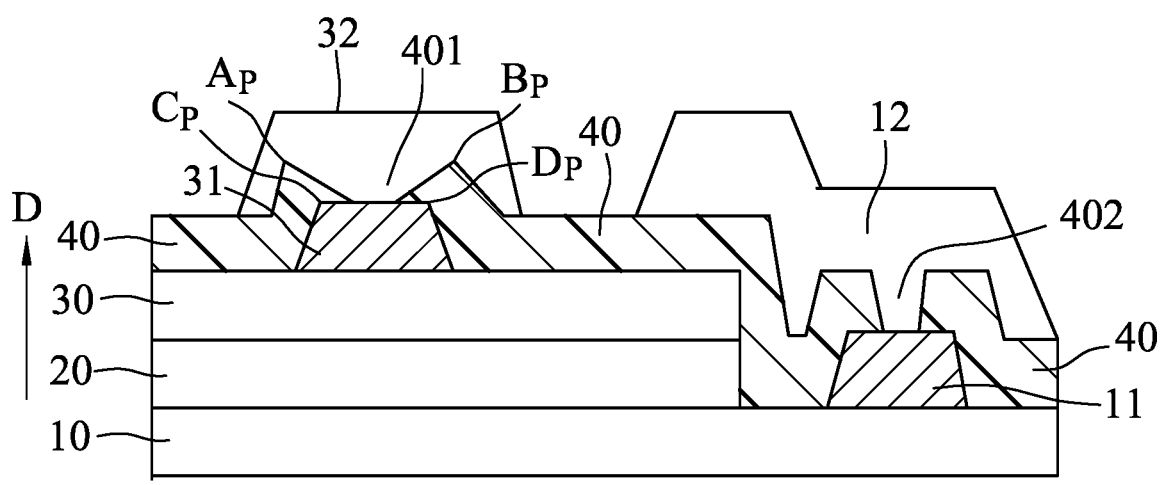
FIG. 2B is a cross-sectional view taken along line B-B' of FIG. 2A.
Figure 3:
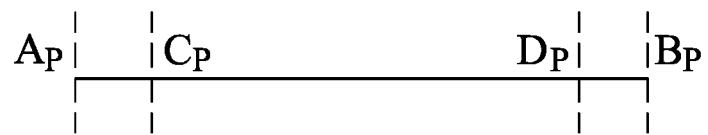
FIG. 3 is a schematic view illustrating relationship of projections of two opposite end points $A_P$, $B_P$ of a top peripheral edge of a first hole-defining wall and two opposite end points $C_P$, $D_P$ of a top surface of a P-type first electrode in the first embodiment.

In this embodiment, the projection of the end points $A_P$, $B_P$ of the top peripheral edge of the first hole-defining wall that defines the first through hole 401 on the first conductivity type semiconductor layer 10 falls outside the projection of two opposite end points $C_P$, $D_P$ of the top surface of the first P-type electrode 31 on the first conductivity type semiconductor layer 10 (see FIG. 3). With the aforesaid structural design, in a cross section of the light-emitting diode chip in the laminating direction (D) as shown in FIG. 2B, the top peripheral edge of the first hole-defining wall that defines the first through hole 401 only has the two end points $A_P$, $B_P$. Thus, an area of the first hole-defining wall that defines the first through hole 401 can be increased, layer continuation of the second P-type electrode 32 on the first insulating layer 40 can be improved and fracture formed in the second P-type electrode 32 can be avoided.

It is noted that, in this embodiment, the laminating direction (D) is a vertical direction.

In this embodiment, the light-emitting diode chip may further include a substrate (not shown) disposed on the first conductivity type semiconductor layer 10 opposite to the light-emitting layer 20. The substrate may be a light-transmissive substrate, an opaque substrate, or a translucent substrate. When the substrate is a light-transmissive substrate or a translucent substrate, light emitted from the light-emitting layer 20 may pass through the substrate in a direction away from the light-emitting unit. In certain embodiments, the substrate may be one of a flat sapphire substrate, a patterned sapphire substrate, a silicon carbide substrate, a gallium nitride substrate, a glass substrate, or combinations thereof. In this embodiment, the substrate is a patterned sapphire substrate.

The substrate has a top surface and a bottom surface, and the top surface of the substrate is used for deposition of the light-emitting unit.

The light-emitting unit can emit light having a certain emission wavelength, and such light may be one of blue light, green light, red light, violet light, and ultraviolet light. In this embodiment, the light emitted from the light-emitting unit is blue light. There are no particular limitations on a material for each of the first conductivity type semiconductor layer 10, the light-emitting layer 20, and the second conductivity type semiconductor layer 30. The first conductivity type semiconductor layer 10 may be made of N-type gallium nitride that provides electrons, the light-emitting layer 20 may be a gallium nitride-based quantum well layer (e.g., a single-layer quantum well structure or a multilayered quantum well structure), and the second conductivity type semiconductor layer 30 may be made of P-type gallium nitride (GaN) that provides holes.

In this embodiment, the DBR layer of the first insulating layer 40 may include multiple pairs of sublayers, and the sublayers in each pair contain a first sublayer and a second sublayer that have different refractive indices. The first sublayers and the second sublayers are alternately stacked in the DBR layer. Each of the first sublayer and the second sublayer may have an optical thickness that is equal to or close to a quarter of an emission wavelength of light emitted from the light-emitting layer 20, depending on a reflectance of the DBR layer with respect to light emitted from the light-emitting layer 20. The reflectance of the DBR layer with respect to light emitted from the light-emitting layer 20 is not smaller than 80%, 90% or 99%. The DBR layer of the first insulating layer 40 does not have an absorption characteristic of a metal reflection mirror, and an energy gap of the DBR layer of the first insulating layer 40 can be adjusted by changing a refractive index or a thickness of the DBR layer. The refractive index of the first sublayer may be higher than that of the second sublayer. The first sublayer may be made of one of titanium dioxide ($TiO_2$), niobium pentoxide ($NB_2O_5$), tantalum pentoxide ($TA_2O_5$), hafnium oxide ($HfO_2$), zirconia ($ZrO_2$), and combinations thereof. The second sublayer may be made of one of silicon dioxide ($SiO_2$), magnesium fluoride ($MgF_2$), aluminum oxide ($Al_2O_5$), silicon oxide ($SiO_N$), and combinations thereof.

In order to ensure the reflectance of the DBR layer, a number of the pairs of the sublayers in the DBR layer may be not smaller than 10 and may be not larger than 50. The DBR layer may have a total thickness that is not smaller than 2 μm, such as ranging from 4 μm to 6 μm.

It is noted that the first insulating layer 40 may include other reflection layers instead of the DBR layer, as long as the other reflection layers are conducive for enhancing a luminous efficiency of the light-emitting diode chip.

The first insulating layer 40 may further include a bottom layer that has a thickness larger than that of each of the sublayers of the DBR layer. The bottom layer may be made of a material that has a low refractive index. The bottom layer and the second sublayer of the DBR layer may be made of a same material. The bottom layer may have a density higher than that of each of the sublayers of the DBR layer. The bottom layer is located proximate to the light-emitting unit relative to the other sublayers of the DBR layer, so as to prevent moisture from diffusing into the light-emitting unit.

Figure 4:
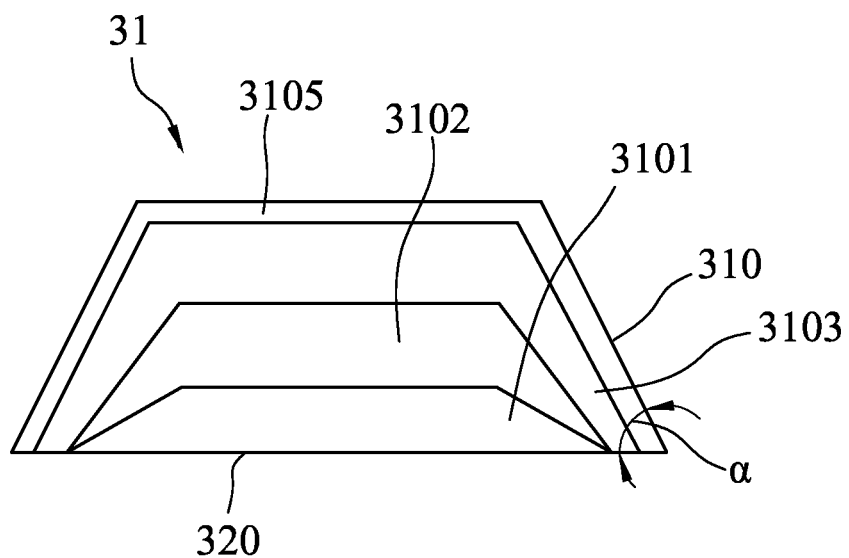
FIG. 4 is a schematic view illustrating the P-type first electrode of the light-emitting diode chip of the first embodiment according to the disclosure.

As shown in FIG. 4, the first P-type electrode 31 includes a slanted side surface 310 and a bottom surface 320 connected to the slanted side surface 310, and an included angle (a) defined between the slanted side surface 310 and the bottom surface 320 is not larger than 45° (the top surface of the first P-type electrode 31 is flat), so that a coverage of the first insulating layer 40 on the top surface and the slanted side surface 310 of the first P-type electrode 31 can be improved.

Specifically, the first P-type electrode 31 may include a bottom adhesive layer 3101, a reflection layer 3102, a blocking layer 3103, and a top adhesive layer 3105.

The bottom adhesive layer 3101 may be a chromium layer, and is used to attach the first P-type electrode 31 to the light-emitting unit (or a current spreading layer 50, which will be described hereinafter). The bottom adhesive layer 3101 is very thin and may have a thickness ranging from 0.1 nm to 10 nm. Light emitted from the light-emitting layer 20 can pass through the bottom adhesive layer 3101 and transmit to the reflection layer 3102.

The reflection layer 3102 is disposed on the bottom adhesive layer 3101, and is used to reflect light emitted from the light-emitting layer 20 and transmitted in a direction toward the first P-type electrode 31. The reflection layer 3102 may be an aluminum layer, an aluminum alloy layer, a stack having an aluminum layer and a titanium layer that are stacked on one another, or a stack having an aluminum alloy layer and a titanium layer that are stacked on one another. The aluminum alloy layer is more stable than the aluminum layer. As compared to the aluminum layer, reduced migration of aluminum atoms and a relatively small amount of aluminum vacancies in the aluminum alloy layer are observed in an aging test under high temperature and high humidity conditions, which reveals that the aluminum alloy layer is conducive for increasing reliability of the first P-type electrode 31 under a large current. The reflection layer 3102 may have a thickness ranging from 50 nm to 200 nm. In certain embodiments, the aluminum alloy layer may be a film layer having aluminum-copper alloy, and may be formed by co-sputtering. In such case, an atomic percentage of copper atoms in the film layer having aluminum-copper alloy (i.e., a ratio of a number of the copper atoms to a total number of the copper and aluminum atoms in the film layer having aluminum-copper alloy) may range from 1% to 10%. It is noted that a higher percentage of the copper atoms in the film layer having aluminum-copper alloy may easily cause reduced reflectance of the reflection layer 3102.

The blocking layer 3103 is disposed on the reflection layer 3102 opposite to the bottom adhesive layer 3101. The blocking layer 3103 may be a platinum layer, a stack having a titanium layer and a platinum layer that are stacked on one another, or a stack having a platinum layer and a nickel layer that are stacked on one another. The blocking layer 3103 can be used to prevent (i) the reflection layer 3102 (e.g., the aluminum layer or the aluminum alloy layer) from being damaged or reacted with a metal material for a conducting layer 3104 (if any, which will be described hereinafter), water or gas, (ii) a degraded performance of the reflection layer 3102, and (iii) the migration of the aluminum atoms. The blocking layer 3103 may have a thickness ranging from 50 nm to 300 nm.

The top adhesive layer 3105 is disposed on the blocking layer 3103 opposite to the reflection layer 3102. The top adhesive layer 3105 may be a titanium layer or a nickel layer. The top adhesive layer 3105 can be used to enhance adhesion between the first insulating layer 40 and the top surface of the first P-type electrode 31. The top adhesive layer 3105 may have a thickness ranging from 1 nm to 200 nm.

In certain embodiments, a total thickness of the first P-type electrode 31 may be not larger than 500 nm. In certain embodiments, the first P-type electrode 31 may only include the bottom adhesive layer 3101, the reflection layer 3102 disposed on the bottom adhesive layer 3101, and the blocking layer 3103 disposed on the reflection layer 3102 opposite to the bottom adhesive layer 3101, so that the thickness of the first P-type electrode 31 can be reduced and the included angle (a) between the slanted side surface 310 of the first P-type electrode 31 and the bottom surface 320 of the first P-type electrode 31 can be lower, which is conducive for improving the coverage of the first insulating layer 40 on the top surface and the slanted side surface 310 of the first P-type electrode 31. In such case, the included angle (a) is not larger than 45°. In certain embodiments, the first P-type electrode 31 is free of gold.

Figure 5:
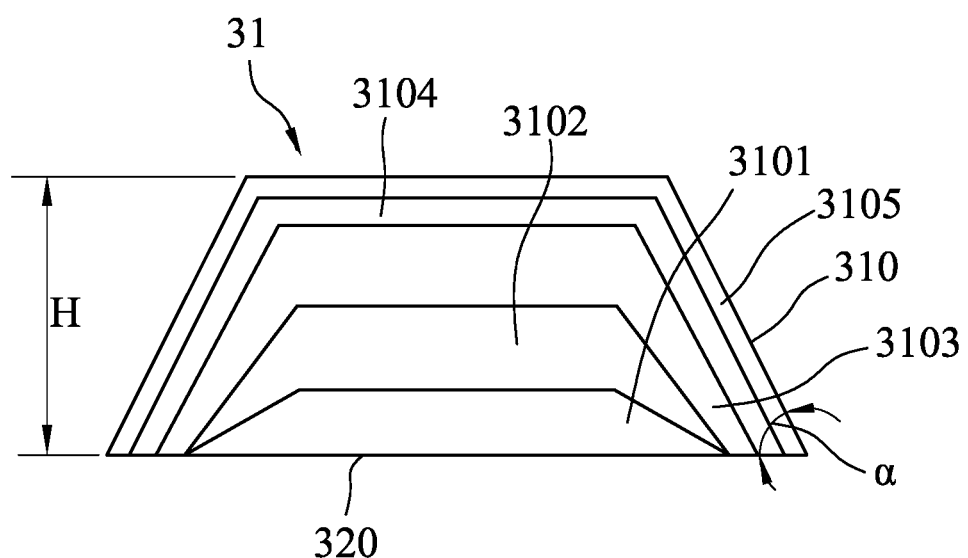
FIG. 5 is a schematic view showing another configuration of the first electrode of the light-emitting diode chip of the first embodiment according to the disclosure.

In certain embodiments, the first P-type electrode 31 may further include a conducting layer 3104 disposed between the blocking layer 3103 and the top adhesive layer 3105 (see FIG. 5). The conducting layer 3104 may be a gold layer. In such case, the blocking layer 3103 can be used to prevent the metal in the reflection layer 3102 (e.g., the aluminum layer) from being reacted with or dissolved with the metal in the conducting layer 3104 (e.g., the gold layer) to thereby avoid an increased voltage of the light-emitting diode chip.

In certain embodiments, a width of the top surface of the first P-type electrode 31 is greater than a width of the bottom opening of the first through hole 401. In this embodiment, a width of the top opening of the first through hole 401 is greater than the width of the top surface of the first P-type electrode 31.

However, it is noted that if a width of the first through hole 401 is too large, an area of the DBR layer of the first insulating layer 40 may be reduced and the reflectance thereof may be decreased.

In certain embodiments, the first through hole 401 has a depth that is between the top opening and the bottom opening of the first through hole 401, and that is greater than 2 μm.

In certain embodiments, the first P-type electrode 31 includes a first portion that has one of a circular shape and a strip-like shape, and the first through hole 401 is registered with the first portion. The first portion of the first P-type electrode 31 may have other shapes, such as elliptic shape or polygon shape.

In certain embodiments, the first P-type electrode 31 may further include a second portion extending from the first portion. In such case, the first portion has the circular shape, and the second portion has a strip-like shape (see FIG. 2A). The second portion having the strip-like shape is conducive for a lateral spreading of a current. In certain embodiments, a width of the second portion is smaller than that of the first portion. In certain embodiments, a width of an upper surface of the first portion may range from 15 μm to 50 μm, such as 20 μm to 30 μm. In certain embodiments, the width of the bottom opening of the first through hole 401 may range from 5 μm to 40 μm.

Figure 6:
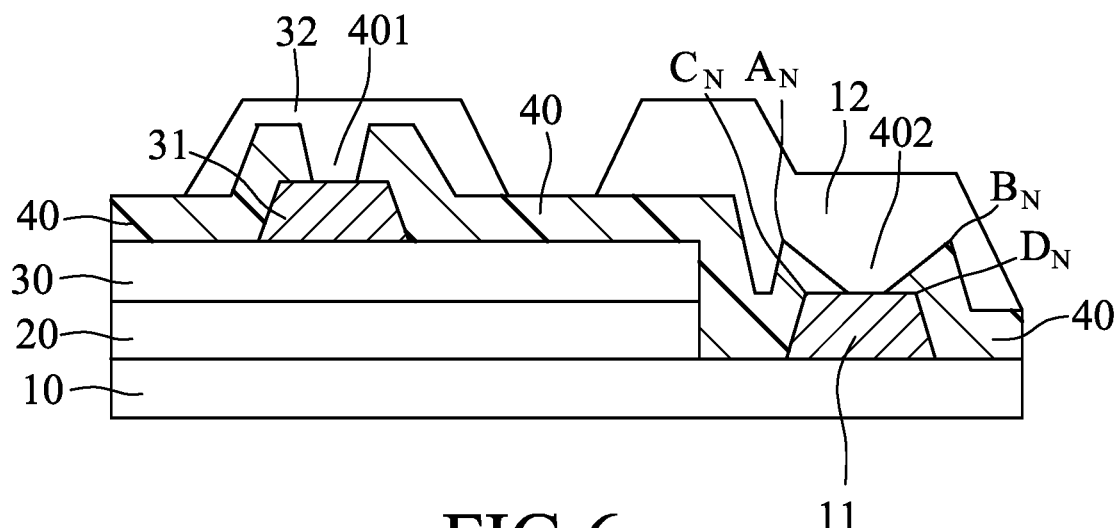
FIG. 6 is a first variation of the first embodiment.
Figure 7:
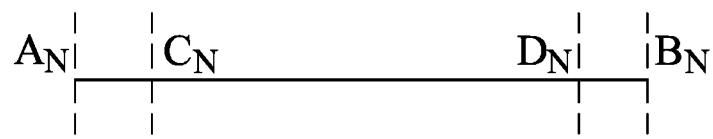
FIG. 7 is a schematic view illustrating relationship of projections of two opposite end points $A_N$, $B_N$ of a top peripheral edge of another first hole-defining wall and two opposite end points $C_N$, $D_N$ of a top surface of an N-type first electrode in the first embodiment.

In a first variation of the first embodiment, as shown in FIGS. 6 and 7, a projection of at least one of end points $A_N$, $B_N$ of a top peripheral edge of the first hole-defining wall (i.e., defining the first through hole 402) on the first conductivity type semiconductor layer 10 falls outside a projection of the top surface of the first N-type electrode 11 on the first conductivity type semiconductor layer 10. Specifically, in this variation, the projection of two opposite end points $A_N$, $B_N$ of the top peripheral edge of the other first hole-defining wall on the first conductivity type semiconductor layer 10 falls outside a projection of a top surface (or two opposite end points $C_N$, $D_N$ of the top surface) of the first N-type electrode 11 on the first conductivity type semiconductor layer 10. With the aforesaid structural design, in a cross section of the light-emitting diode chip in the laminating direction (D) as shown in FIG. 6, a portion of the first insulating layer 40 disposed between the first N-type electrode 11 and the second N-type electrode 12 and defining the first through hole 402 only has the two end points $A_N$, $B_N$. Thus, an area of the first hole-defining wall that defines the first through hole 402 can be increased, layer continuation of the second N-type electrode 12 on the first insulating layer 40 can be improved, and fracture formed in the second N-type electrode 12 can be avoided.

In certain embodiments, a width of the top surface of the first N-type electrode 11 is greater than a width of the bottom opening of another first through hole 402.

Each of the first hole-defining walls has a cross section in the laminating direction (D). It is noted that each of the second P-type electrode 32 and the second N-type electrode 12 may have a poor coverage on the first insulating layer 40 if a large included angle (e.g., greater than 60°) defined between each of the first hole-defining walls and the top surface of a corresponding one of the first P-type electrode 31 and the first N-type electrode 11. In order to avoid the poor coverage of the second P-type electrode 32 and the second N-type electrode 12, the included angle defined between each of the first hole-defining walls and the top surface of the corresponding one of the first P-type electrode 31 and the first N-type electrode 11 is design to be not greater than 60°, such as ranging from 10° to 60°. In certain embodiments, an included angle defined between the top surface of the first P-type electrode 31 and a tangent line at the topmost end point of the cross section of a corresponding one of the first hole-defining walls may range from 10° to 60°, and an included angle defined between the top surface of the first N-type electrode 11 and a tangent line at the topmost end point of the cross section of a corresponding one of the first hole-defining walls may range from 10° to 60°. By controlling the included angle not greater than 60° (e.g., ranging from 10° to) 60° and the projection of the at least one of the end points $A_N$, $B_N$ falling outside the projection of the top surface of the first N-type electrode 11, the coverage of the second P-type electrode 32 and the second N-type electrode 12 on the first hole-defining walls can be improved.

Figure 8:
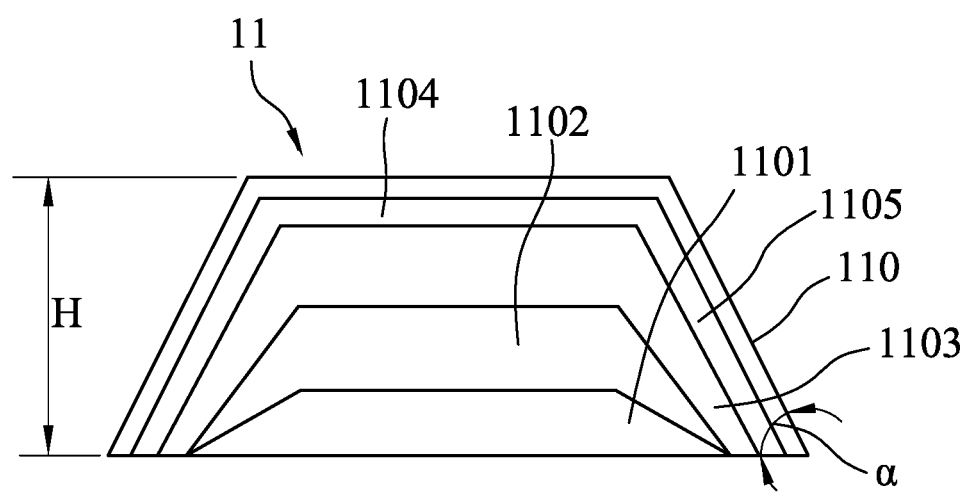
FIG. 8 is a schematic view illustrating the N-type first electrode of the light-emitting diode chip of the first embodiment according to the disclosure.

FIG. 8 illustrates that the first N-type electrode may include a bottom adhesive layer 1101, a reflection layer 1102, a blocking layer 1103, a conducting layer 1104, and a top adhesive layer 1105. The bottom adhesive layer 1101 may be a chromium layer. The reflection layer 1102 is disposed on the bottom adhesive layer 1101. The reflection layer 1102 may be an aluminum layer, an aluminum alloy layer, a stack having an aluminum layer and a titanium layer that are stacked on one another, or a stack having an aluminum alloy layer and a titanium layer that are stacked on one another. The blocking layer 1103 is disposed on the reflection layer 1102 opposite to the bottom adhesive layer 1101. The blocking layer 1103 may be a platinum layer or a stack having a titanium layer and a platinum layer that are stacked on one another. The conducting layer 1104 is disposed on the blocking layer 1103 opposite to the reflection layer 1102. The conducting layer 1104 may be a gold layer. The top adhesive layer 1105 is disposed on the conducting layer 1104 opposite to the blocking layer 1103. The top adhesive layer 1105 may be a titanium layer.

In certain embodiments, the first through hole 402 that exposed the first N-type electrode 11 has a depth (H) that is between the top opening and the bottom opening, and that is greater than 2 µm.

Each of the second P-type electrodes 32 and the second N-type electrode 12 may include an adhesive layer, a reflection layer, an eutectic layer, and a protective layer (not shown). The adhesive layer may be made of chromium. The reflection layer may be disposed on the adhesive layer. The reflection layer may be an aluminum layer, an aluminum alloy layer, or a stack having an aluminum layer and a titanium layer that are stacked on one another. The eutectic layer may be disposed on the reflection layer opposite to the adhesive layer, and may be made of one of nickel layer, chromium-nickel alloy, and nickel-platinum alloy. The protective layer may be disposed on the eutectic layer opposite to the reflection layer, and may be made of one of gold, tin, gold-tin alloy.

Each of the second P-type electrodes 32 and the second N-type electrode 12 can serve as an electrode pad, and can form an eutectic bond with a circuit layer of a circuit board of a packaging device (e.g., a light lamp) or an electrical device (e.g., a backlight display device) through a reflow soldering process, so as to mount the light-emitting diode chip on the circuit board of the packaging device or the electrical device. In addition, the second P-type electrode 32 and the second N-type electrode 12 may be separated by a certain distance, to thereby prevent the second P-type electrode 32 and the second N-type electrode 12 are connected to each other through a solder paste or a molten solder paste in the reflow soldering process.

In certain embodiments, the structure and material for at least one of the second P-type electrode 32 and the second N-type electrode 12 may be the same as or similar to that of the first P-type electrodes 31 and the first N-type electrode 11, and thus details thereof are omitted for the sake of brevity.

The second P-type electrode 32 and the second N-type electrode 12 may have thicknesses larger than those of the first P-type electrode 31 and the first N-type electrode 11, respectively. The thickness of each of the second P-type electrode 32 and the second N-type electrode 12 may range from 1000 nm to 3000 nm, which is conducive for a lateral spreading of a current in each of the second P-type electrode 32 and the second N-type electrode 12.

Figure 9:
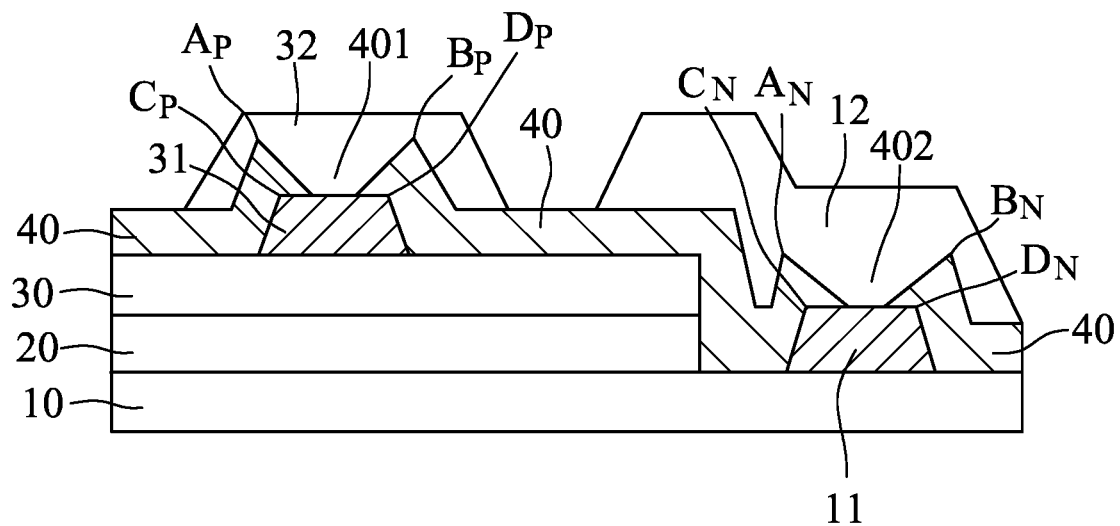
FIG. 9 is a second variation of the first embodiment.

In a second variation of the first embodiment, as shown in FIG. 9, the projection of the end points $A_P$, $B_P$ of the top peripheral edge of the first hole-defining wall that defines the first through hole 401 on the first conductivity type semiconductor layer 10 falls outside the projection of the top surface (or the two opposite end points $C_P$, $D_P$ of the top surface) of the first P-type electrode 31 on the first conductivity type semiconductor layer 10, and the projection of the end points $A_N$, $B_N$ of the top peripheral edge of the first hole-defining wall that defines the first through hole 402 on the first conductivity type semiconductor layer 10 falls outside the projection of the top surface (or the two opposite end points $C_N$, $D_N$ of the top surface) of the first N-type electrode 11 on the first conductivity type semiconductor layer 10.

Figure 10:
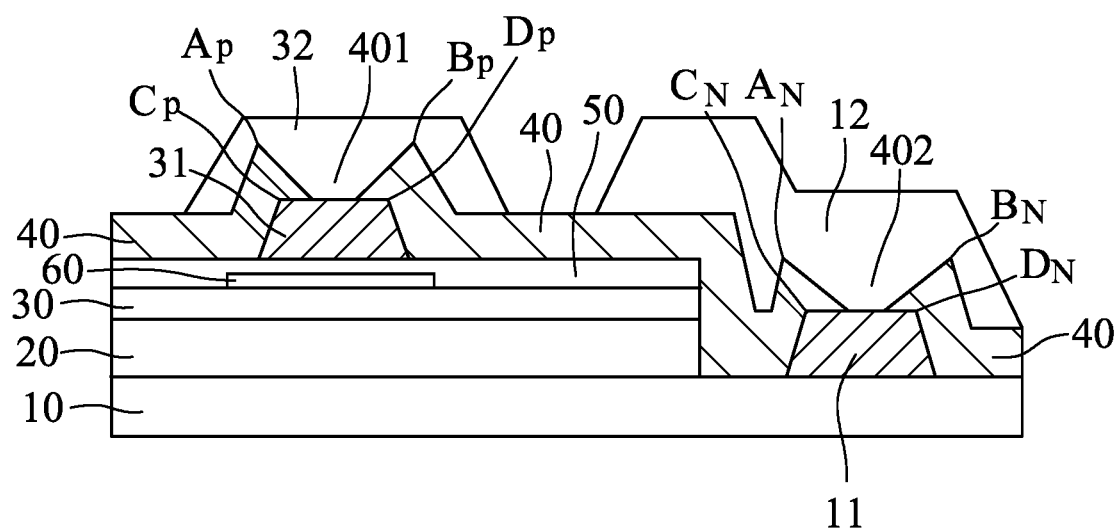
FIG. 10 is a schematic view illustrating a second embodiment of the light-emitting diode chip according to the disclosure.
Figure 11A:
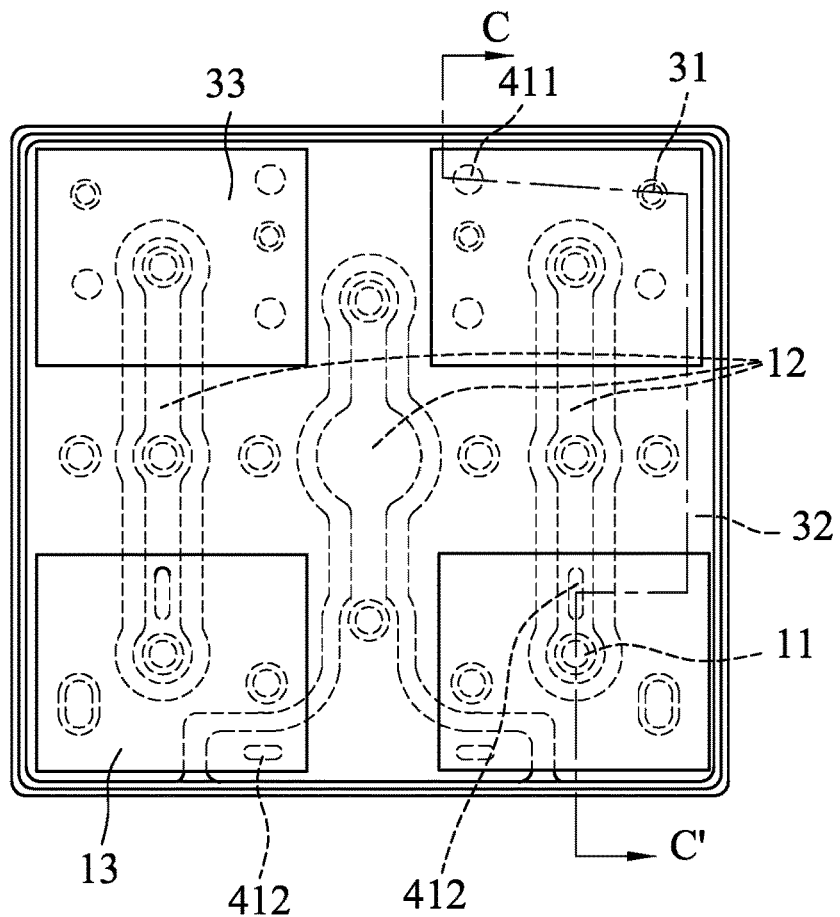
FIG. 11A is a schematic view illustrating a third embodiment of the light-emitting diode chip according to the disclosure.
Figure 11B:
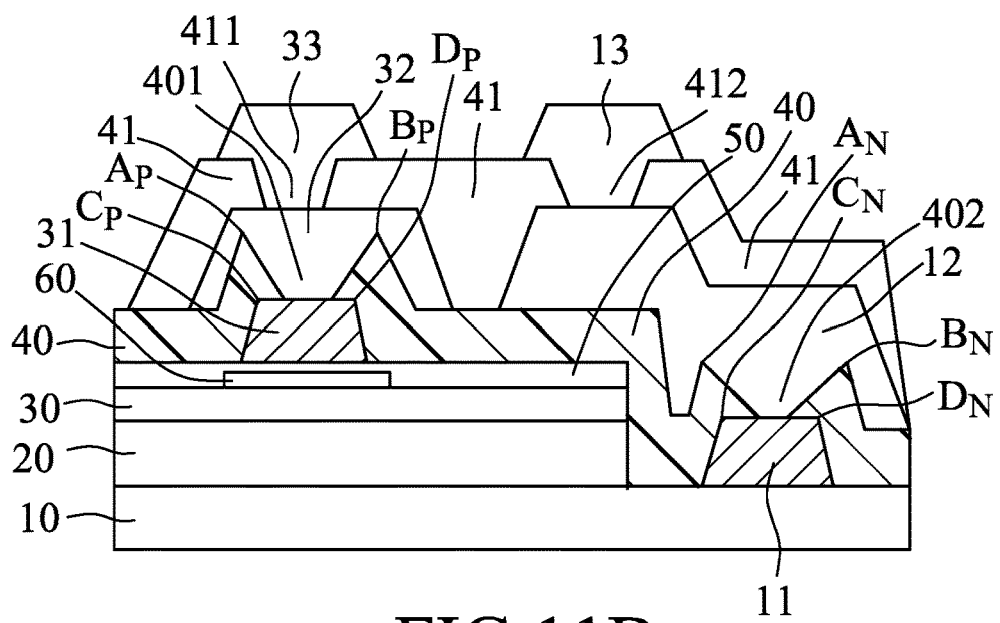
FIG. 11B is a cross-sectional view taken along line C-C' of FIG. 11A.

Referring to FIG. 10, a second embodiment of the light-emitting diode chip according to the present disclosure is generally similar to the second variation of the first embodiment, except that, in the second embodiment, the light-emitting diode chip further includes the current spreading layer 50 and a current blocking layer 60.

Specifically, the current spreading layer 50 is disposed between the first P-type electrode 31 and the second conductivity type semiconductor layer 30, and the current blocking layer 60 is disposed in the current spreading layer 50 and is registered with the first P-type electrode 31.

The current spreading layer 50 may be a transparent conducting layer that is made of indium tin oxide (ITO), and that is formed by one of evaporation and sputtering. The current spreading layer 50 may be made of other materials, such as zinc oxide (ZnO) or graphene. In the case that the current spreading layer 50 is the transparent conducting layer of ITO, a surface of the transparent conducting layer may be patterned to form a roughening structure, which can further increase a light-emitting area of the transparent conducting layer. The current blocking layer 60 may include one of a silicon dioxide ($SiO_2$) layer, a silicon nitride ($Si_3O_4$) layer, an aluminum oxide ($Al_2O_3$) layer, an aluminum nitride (AlN) layer, a DBR layer, and combinations thereof.

Referring to FIGS. 11A to 13, a third embodiment of the light-emitting diode chip according to the present disclosure is generally similar to the second variation of the first embodiment, except that, in the third embodiment, the light-emitting diode chip further includes a second insulating layer 41, the N-type electrode unit further includes a third N-type electrode 13, and the P-type electrode unit further includes a third P-type electrode 33.

The second insulating layer 41 is disposed on the second N-type electrode 12 and the second P-type electrode 32, and has second through holes 411, 412 that penetrate the second insulating layer (41) and that respectively terminate at top surfaces of the second p-type electrodes 32 and the second N-type electrode 12 to expose the top surfaces of the second p-type electrode 32 and the second N-type electrode 12.

The third P-type electrode 33 is disposed on the second insulating layer 41, and fills a corresponding one of the second through holes 411, 412, so as to electrically connect to the second P-type electrode 32. The third N-type electrode 13 is disposed on the second insulating layer 41, and fills a corresponding one of the second through holes 411, 412, so as to electrically connect to the second N-type electrode 12.

In certain embodiments, the second insulating layer 41 may have a thickness ranging from 800 nm to 2000 nm. In such case, the thickness of the second insulating layer 41 is larger than hat of a conventional insulating layer (e.g., 80 nm), which is conducive for enhancing an anti-electrostatic discharge (ESD) capability of the light-emitting diode chip under a large current. It is noted that, if the thickness of the second insulating layer 41 is too small, e.g., lower than 800 nm, the light-emitting diode chip may be easily damaged or have an electrical leakage due to ESD. If the thickness of the second insulating layer 41 is too large, greater than 2000 nm, the light-emitting diode chip may have a high production cost.

In this embodiment, the second insulating layer 41 has an insulating function and a moisture-proof function. The second insulating layer 41 may be a single layer that has a low refractive index or a high refractive index. The second insulating layer 41 may include a DBR layer. The second insulating layer 41 may have a structure the same as or similar to that of the first insulating layer 40, and thus a detail thereof is omitted for the sake of brevity. In certain embodiments, the second insulating layer 41 is a single layer that has the low refractive index and that is made of silicon oxide.

The second insulating layer 41 has second hole-defining walls that define the second through holes 411, 412, respectively. In this embodiment, each of the second hole-defining walls that respectively define the second through holes 411, 412 may be formed as one of a curved structure and a linear structure.

Figure 12:
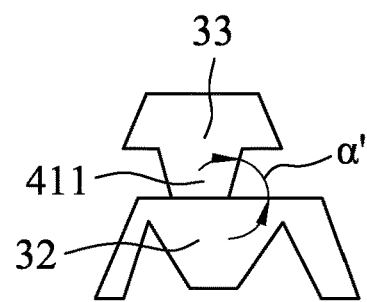
FIG. 12 is a schematic view illustrating an included angle defined between a second hole-defining wall that defines a second through hole and a top surface of a second P-type electrode.

In this embodiment, an included angle (a') defined between a top surface of the second P-type electrode 32 and the second hole-defining wall that defines the second through hole 411 and that is filled with the third P-type electrode 33 ranges from 10° to 60° (see FIG. 12).

Figure 13:
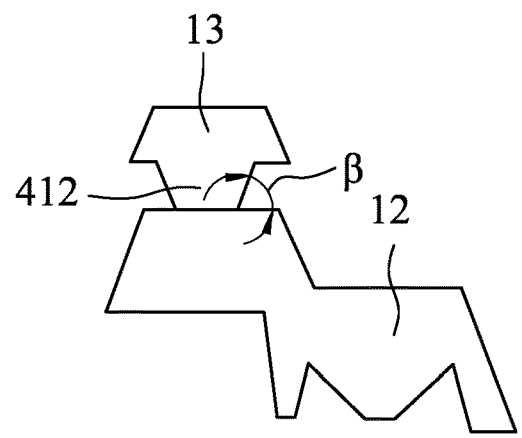
FIG. 13 is a schematic view illustrating an included angle defined between another second hole-defining wall that defines another second through hole and a top surface of a second N-type electrode.

Likewise, an included angle (β) defined between a top surface of the second N-type electrode 12 and the second hole-defining wall that defines the second through hole 412 and that is filled with the third N-type electrode 33 ranges from 10° to 60° (see FIG. 13).

In this embodiment, the second hole-defining wall that defines the second through hole 411 has a top peripheral edge that defines a top opening of the second through hole 411. The top peripheral edge of each of the second hole-defining walls may have two opposite end points. A projection of at least one of the end points of the top peripheral edge of the second hole-defining wall disposed on the second P-type electrode 32 on the first conductivity type semiconductor layer 10 may fall outside a projection of the top surface of the second P-type electrode 32 on the first conductivity type semiconductor layer 10, which is conducive for formation of the third P-type electrode 33 without fractures on the second insulating layer 41 and in the second through hole 411. Likewise, a projection of at least one of the end points of the top peripheral edge of the second hole-defining wall disposed on the second N-type electrode 12 on the first conductivity type semiconductor layer 10 may fall outside a projection of the top surface of the second N-type electrode 12 on the first conductivity type semiconductor layer 10, which is conducive for formation of the third N-type electrode 13 without fractures on the second insulating layer 41 and in the second through hole 412.

In certain embodiment, the N-type electrode unit includes a plurality of equidistantly-spaced first N-type electrodes 11 each having a circular shape, and the P-type electrode unit includes a plurality of equidistantly-spaced first P-type electrodes 31 each having a circular shape.

It is noted that each of the second N-type electrode and the second P-type electrode 32 serves as an electrically connecting layer. The second N-type electrode 12 and the second P-type electrode 32 are located above the light-emitting unit, and may be separated from each other by a small gap, so that the second N-type electrode 12 and the second P-type electrode 32 can be insulated from each other.

Each of the third N-type electrode 13 and the third P-type electrode 33 serves as an electrode pad. Each of the third N-type electrode 13 and the third P-type electrode 33 can form the eutectic bond with a circuit layer of a circuit board of the packaging device or an electrical device through a reflow soldering process. The structure and material for the third N-type electrode 13 and the third P-type electrode 33 may be the same as or similar to those of the second N-type electrode 12 and the second P-type electrode 32, and thus details thereof are omitted for the sake of brevity.

Because the first through holes 401, 402 and the second through holes 411, 412 are formed by respectively etching the first insulating layer 40 and the second insulating layer 41, the first hole-defining walls that respectively define the first through holes 401, 402 and the second hole-defining walls that respectively define the second through holes 411, 412 are easily formed with bumps, which may cause fracture or layer discontinuation in the second and third N-type electrodes 12, 13, and the second and third P-type electrodes 32, 33. In order to avoid formation of the bumps, at least a part of each of the first hole-defining walls and the second hole-defining walls may be formed as a curved structure.

Figure 14:
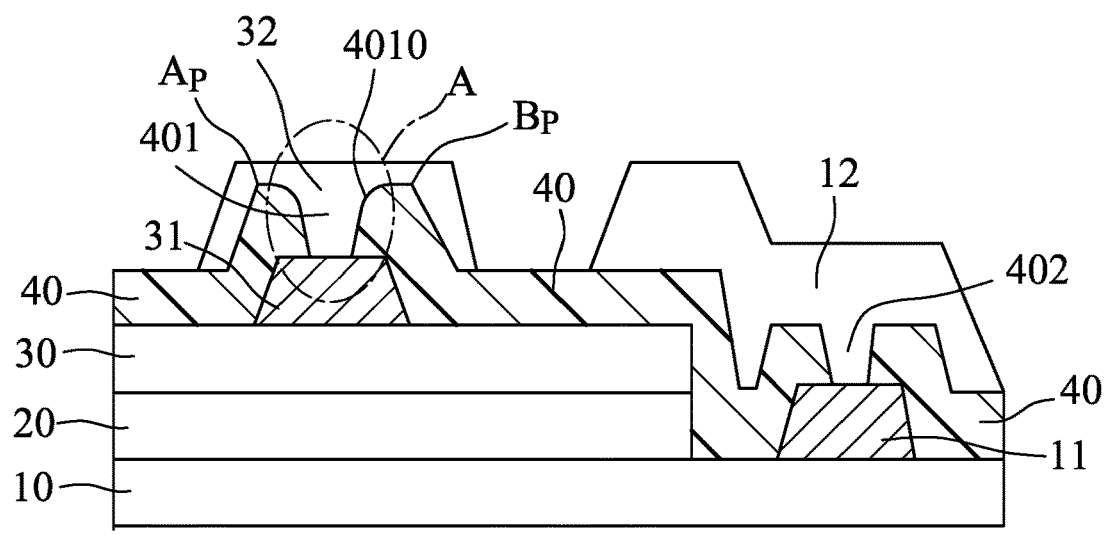
FIG. 14 is a schematic view illustrating a fourth embodiment of the light-emitting diode chip according to the disclosure.
Figure 15:
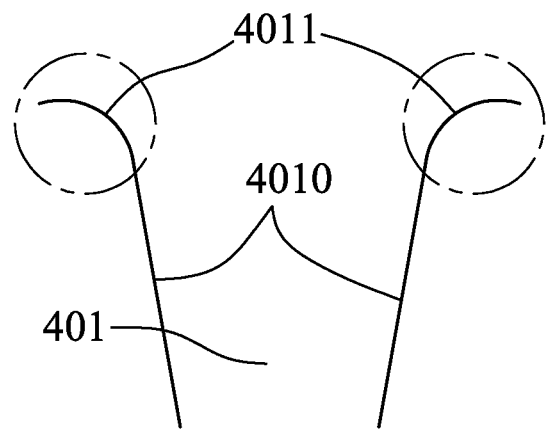
FIG. 15 is a partially enlarged view of circle A of FIG. 14.

Referring to FIGS. 14 and 15, a fourth embodiment of the light-emitting diode chip according to the present disclosure is generally similar to the first embodiment, except that, in the fourth embodiment, the first insulating layer 40 further includes a top wall that interconnects the outer wall and the first hole-defining wall that defines the first through hole 401, and at least a part 4011 of the first hole-defining wall that defines the first through hole 401 on the P-type first electrode 31 and that is adjacent to the top wall is formed as a curved structure, and the remaining part 4010 of the first hole-defining wall that defines the first through hole 401 is formed as a linear structure.

Figure 16:
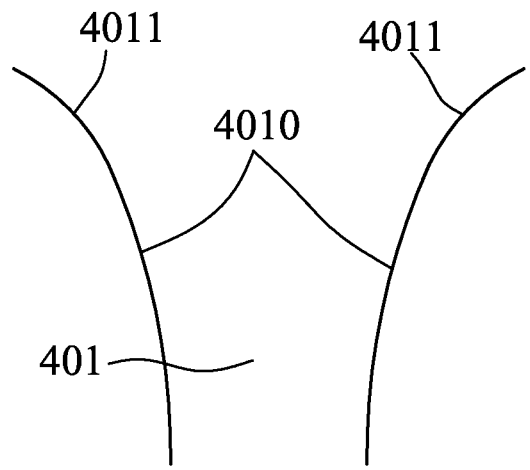
FIG. 16 is a first variation of the fourth embodiment.
Figure 17:
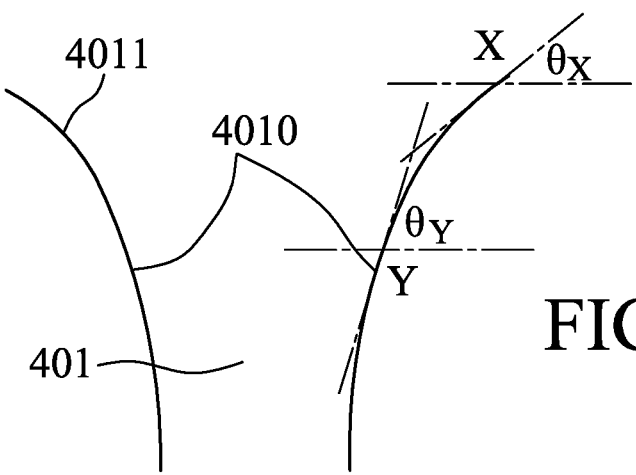
FIG. 17 is a schematic view illustrating included angles respectively defined between tangent lines at points X, Y of a cross section of the first hole-defining wall and imaginary horizontal lines parallel to the top surface of the first electrode.

In a first variation of the fourth embodiment, as shown in FIGS. 16 and 17, the first hole-defining wall that defines the first through hole 401 on the first P-type electrode 31 is completely formed as a curved structure.

The first hole-defining wall that defines the first through hole 401 on the P-type first electrode 31 has a cross section in the laminating direction (D), and included angles each defined between a tangent line at a corresponding point of the cross section and the top surface of the first electrode 31 may exhibit an increasing trend in a downward direction of the cross section. In this variation, an included angle ($\theta_x$) defined between a tangent line at a point X of the cross section and an imaginary horizontal line parallel to the top surface of the first electrode 31 is smaller than an included angle ($\theta_y$) defined between a tangent line at a point Y of the cross section and the imaginary horizontal line parallel to the top surface of the first electrode 31 (see FIG. 17). The point X is a topmost end point of the cross section of the first hole-defining wall that defines the first through hole 401. The included angle ($\theta_x$) may range from 20° to 60°.

By having the at least a part 4011 of the first hole-defining wall that defines the first through hole 401 being formed as a curved structure, the formation of bumps on the first hole-defining wall can be prevented.

Figure 18:
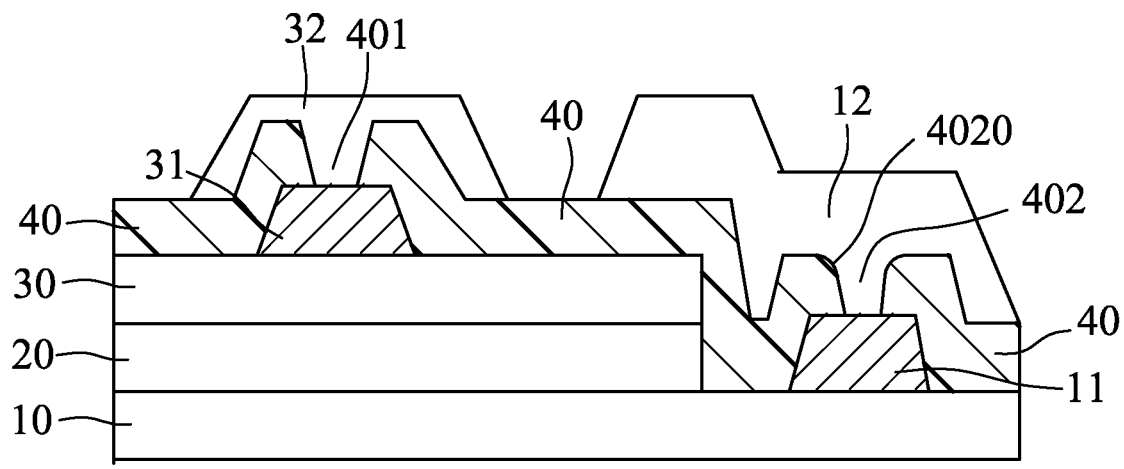
FIG. 18 is a second variation of the fourth embodiment.

In a second variation of the fourth embodiment, as shown in FIG. 18, at least a part 4020 of the first hole-defining wall that defines the first through hole 402 on the first N-type electrode 11 is formed as the curved structure, and the remaining part of the first hole-defining wall that defines the first through hole 402 is formed as a linear structure. In addition, the first hole-defining wall that defines the first through hole 401 is completely formed as a linear structure.

In certain embodiments, the first hole-defining wall that defines the first through hole 402 on the first N-type electrode 11 may be completely formed as the curved structure.

The first hole-defining wall that defines the first through hole 402 on the first N-type electrode 11 has a cross section in the laminating direction (D), and included angles each defined between a tangent line at a corresponding point of the cross section and the top surface of another first electrode 11 may exhibit an increasing trend in a downward direction of the cross section. An included angle defined between a tangent line at a top most end point of the cross section of the first hole-defining wall on the first N-type electrode 11 and an imaginary horizontal line parallel to the top surface of the first electrode 11 may range from 20° to 60°.

By having the at least a part 4020 of the first hole-defining wall that defines the first through hole 402 on the first N-type electrode 11 being formed as the curved structure, the formation of bumps on the first hole-defining wall can be prevented.

Figure 19:
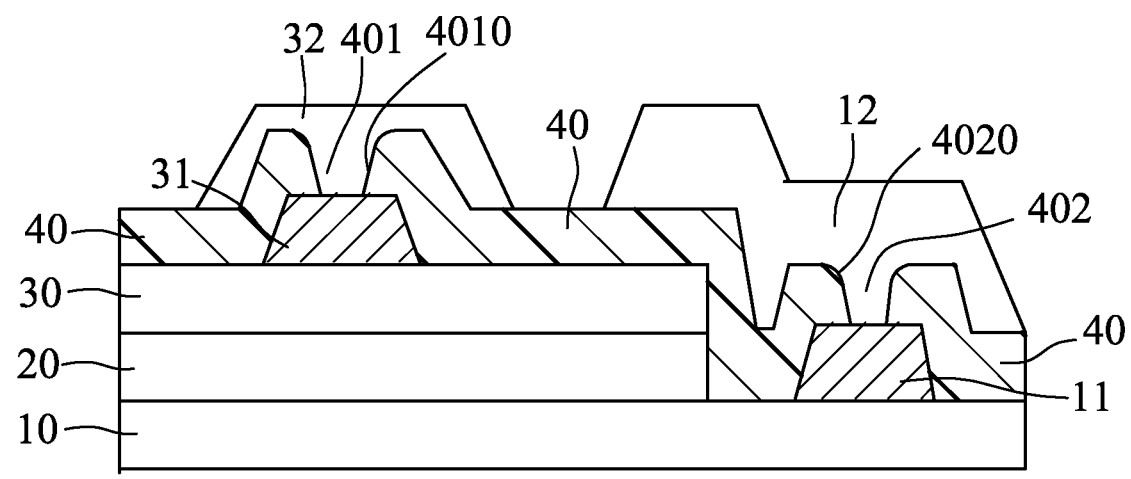
FIG. 19 is a third variation of the fourth embodiment.

In a third variation of the fourth embodiment, as shown in FIG. 19, each of the at least a part 4011 of the first hole-defining wall that defines the first through hole 401 on the first P-type electrode 31 and the at least a part 4020 of the first hole-defining wall that defines the first through hole 402 on the first N-type electrode 11 is formed as the curved structure.

Figure 20:
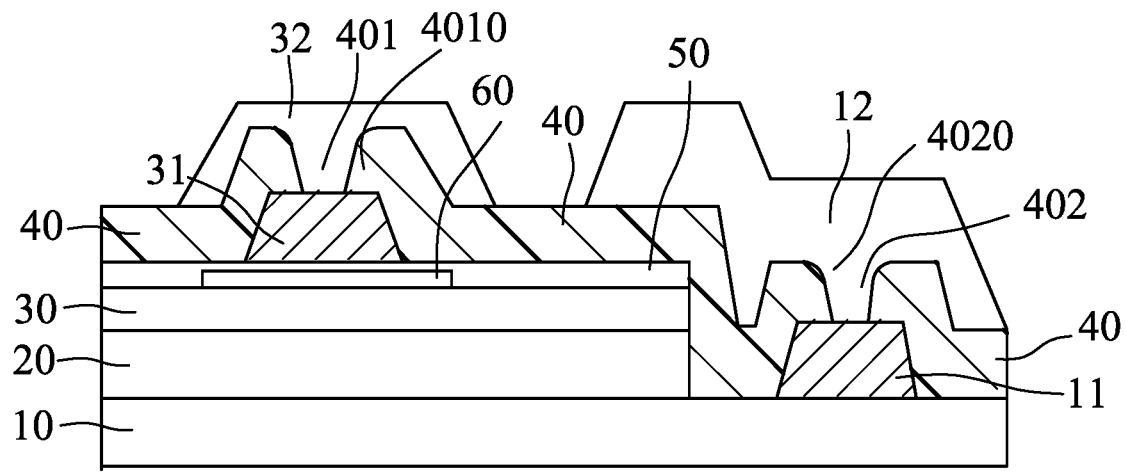
FIG. 20 is a fifth embodiment of the light-emitting diode chip according to the disclosure.

Referring to FIG. 20, a fifth embodiment of the light-emitting diode chip according to the present disclosure is generally similar to the third variation of the fourth embodiment, except that, in the fifth embodiment, the light-emitting diode chip further includes a current spreading layer 50 and a current blocking layer 60. In the fifth embodiment, structures, positions, and the material of the current spreading layer 50 and the current blocking layer 60 may be the same as or similar to those of the second embodiment shown in FIG. 10, and thus details thereof are omitted for the sake of brevity.

Figure 21:
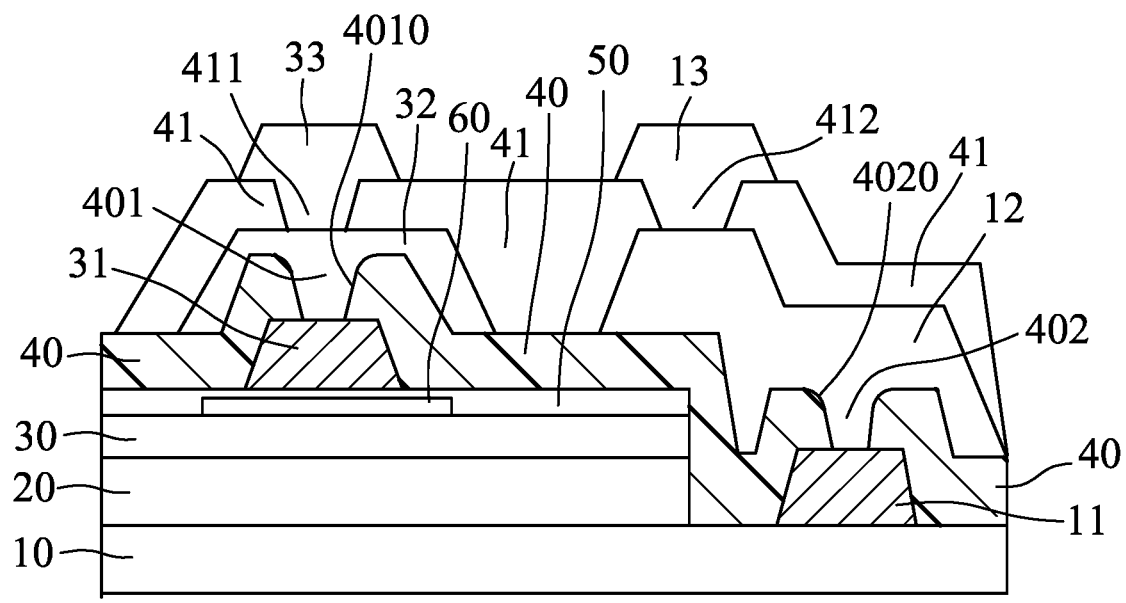
FIG. 21 is a first variation of the fifth embodiment.

In a first variation of the fifth embodiment, as shown in FIG. 21, the light-emitting diode chip further includes a second insulating layer 41, a third P-type electrode 33, and a third N-type electrode 13. In the first variation of the fifth embodiment, structures, positions, and the material of the second insulating layer 41, the third P-type electrode 33, and the third N-type electrode 13 may be the same as or similar to those of the third embodiment shown in FIGS. 11A to 13, and thus details thereof are omitted for the sake of brevity.

Specifically, in this variation, at least a part of each of the first hole-defining walls that respectively defines the first through holes 401, 402 is formed as the curved structure, which is conducive for improving the formation of the third electrodes 33, 13.

Figure 22:
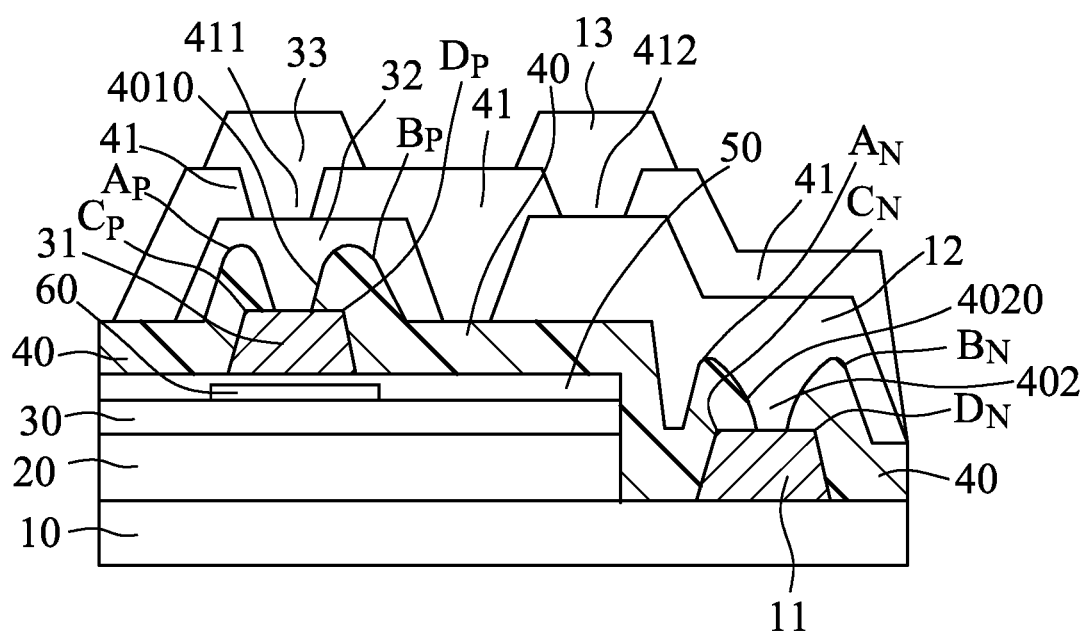
FIG. 22 is a second variation of the fifth embodiment.

In a second variation of the fifth embodiment, as shown in FIG. 22, the light-emitting diode chip further includes the second insulating layer 41, the third P-type electrode 33, and the third N-type electrode 13 as shown in FIG. 20. Furthermore, in the second variation of the fifth embodiment, each of the outer walls and the first hole-defining walls that respectively defines the first through holes 401, 402 is completely formed as the curved structure.

This disclosure also provides a light-emitting module that includes the light-emitting diode chip.

This disclosure also provides a display device that includes the light-emitting module as mentioned above.

In certain embodiments, the light-emitting diode chip can be applied in various fields, such as chip-on-board (COB) lighting, flexible filament, and backlight display.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode chip, comprising:
   a light-emitting unit including a first conductivity type semiconductor layer, a second conductivity type semiconductor layer, and a light-emitting layer disposed between said first conductivity type semiconductor layer and said second conductivity type semiconductor layer in a laminating direction;
   a first electrode disposed on said light-emitting unit in said laminating direction;
   an insulating layer disposed on said first electrode and said light-emitting unit, said insulating layer having a through hole and a hole-defining wall that defines said through hole, said through hole penetrating through said insulating layer and terminating at a top surface of said first electrode, and having a top opening and a bottom opening opposite to said top opening, said top opening distal from said top surface of said first electrode, said bottom opening adjacent to said top surface of said first electrode, said hole-defining wall having a top peripheral edge that defines said top opening, said top peripheral edge having two opposite end points, a projection of at least one of said end points of said top peripheral edge of said hole-defining wall on said first conductivity type semiconductor layer falling outside a projection of said top surface of said first electrode on said first conductivity type semiconductor layer; and a second electrode disposed on said insulating layer and filling said through hole, so as to electrically connect to said first electrode, wherein said hole-defining wall is completely formed as a curved structure, and wherein said hole-defining wall has a cross section in said laminating direction, included angles each defined between a tangent line at a corresponding point of said cross section and said top surface of said first electrode exhibiting an increasing trend in a downward direction of said cross section.

2. The light-emitting diode chip of claim 1, wherein a width of said top surface of said first electrode is greater than a width of said bottom opening of said through hole.

3. The light-emitting diode chip of claim 1, wherein said through hole has a depth that is between said top opening and said bottom opening, and that is greater than 2 μm.

4. The light-emitting diode chip of claim 1, wherein said insulating layer includes a distributed Bragg reflection (DBR) layer.

5. The light-emitting diode chip of claim 1, wherein said included angle defined between said tangent line at a topmost end point of said cross section of said hole-defining wall and said top surface of said first electrode ranges from 20° to 60°.

6. The light-emitting diode chip of claim 1, wherein said first electrode includes a slanted side surface and a bottom surface connected to said slanted side surface, an included angle defined between said slanted side surface and said bottom surface being not larger than 45°.

7. The light-emitting diode chip of claim 1, wherein said first electrode includes a film layer having aluminum alloy.

8. The light-emitting diode chip of claim 1, wherein said first electrode includes a film layer having aluminum-copper alloy.

9. The light-emitting diode chip of claim 1, wherein said first electrode is free of gold.

10. The light-emitting diode chip of claim 1, wherein said first electrode has a thickness that is not larger than 500 nm.

11. The light-emitting diode chip of claim 1, further comprising a second insulating layer and a third electrode, said second insulating layer having a second through hole that penetrates said second insulating layer and that terminates at a top surface of said second electrode to expose said top surface of said second electrode, said third electrode disposed on said second insulating layer and filling said second through hole, so as to electrically connect to said second electrode.

12. The light-emitting diode chip of claim 11, wherein said second insulating layer has a second hole-defining wall that defines said second through hole, and an included angle between said second hole-defining wall and said top surface of said second electrode ranges from 10° to 60°.

13. The light-emitting diode chip of claim 12, wherein said second insulating layer has a thickness ranging from 800 nm to 2000 nm.

14. The light-emitting diode chip of claim 1, wherein said projection of said end points of said top peripheral edge of said hole-defining wall on said first conductivity type semiconductor layer falls outside said projection of said top surface of said first electrode on said first conductivity type semiconductor layer.

15. The light-emitting diode chip of claim 1, wherein said first electrode includes a first portion that has a circular shape, said through hole being registered with said first portion.

16. The light-emitting diode chip of claim 15, wherein said first electrode further includes a second portion extending from said first portion, said first portion having the circular shape, said second portion having a strip-like shape.

17. A light-emitting device, comprising the light-emitting diode chip as claimed in claim 1.

* * * * *